(12) United States Patent
Pellegrin

(10) Patent No.: US 7,524,745 B2
(45) Date of Patent: Apr. 28, 2009

(54) METHOD AND DEVICE FOR DOPING, DIFFUSION AND OXIDATION OF SILICON WAFERS UNDER REDUCED PRESSURE

(75) Inventor: Yvon Pellegrin, Montpellier (FR)

(73) Assignee: Semco Engineering SA, Montpellier (FR)

( * ) Notice: Subject to any disclaimer, the term of this patent is extended or adjusted under 35 U.S.C. 154(b) by 940 days.

(21) Appl. No.: 10/477,597

(22) PCT Filed: May 14, 2002

(86) PCT No.: PCT/FR02/01620

§ 371 (c)(1),
(2), (4) Date: Apr. 19, 2004

(87) PCT Pub. No.: WO02/093621

PCT Pub. Date: Nov. 21, 2002

(65) Prior Publication Data

US 2004/0175956 A1  Sep. 9, 2004

(30) Foreign Application Priority Data

May 14, 2001  (FR) .................................. 01 06863

(51) Int. Cl.
*H01L 21/22* (2006.01)
(52) U.S. Cl. ...................... 438/542; 438/770; 219/391; 219/406; 257/E21.002

(58) Field of Classification Search ................. 438/542, 438/770; 219/391, 406
See application file for complete search history.

(56) References Cited

U.S. PATENT DOCUMENTS

| 6,171,104 | B1 * | 1/2001 | Saito et al. ..................... 432/18 |
| 6,187,102 | B1 | 2/2001 | Yamamoto |
| 6,403,925 | B1 * | 6/2002 | Johnsgard et al. ........... 219/390 |
| 6,605,352 | B1 * | 8/2003 | Windischmann ............ 428/408 |
| 7,138,016 | B2 * | 11/2006 | Reardon et al. ............. 118/313 |
| 2001/0000747 | A1 | 5/2001 | Richter et al. |

* cited by examiner

*Primary Examiner*—N Drew Richards
*Assistant Examiner*—Christy L Novacek
(74) *Attorney, Agent, or Firm*—Young & Thompson

(57) ABSTRACT

Method and device for doping or diffusion, or oxidation of silicon wafers (4), the wafers being introduced into the chamber (2) of an oven (1) wherein is introduced at least a gas for performing the doping or diffusion or oxidation process. The method comprises simultaneously with the introduction and passage of gas into the chamber (2) of the oven (1), continuously subjecting the latter to a depression of constant value. The device comprises an oven (1) provided with a chamber (2) wherein are introduced the wafers, the oven including at least an inlet tube (5a, 5b, 5c) for introducing at least a gas into the chamber (2) to carry out the processes and at least an outlet tube (6) for extracting the gas whereto is connected a suction unit (7) for generating in the chamber (2) a constant and controlled depression.

20 Claims, 2 Drawing Sheets

Figure 1:
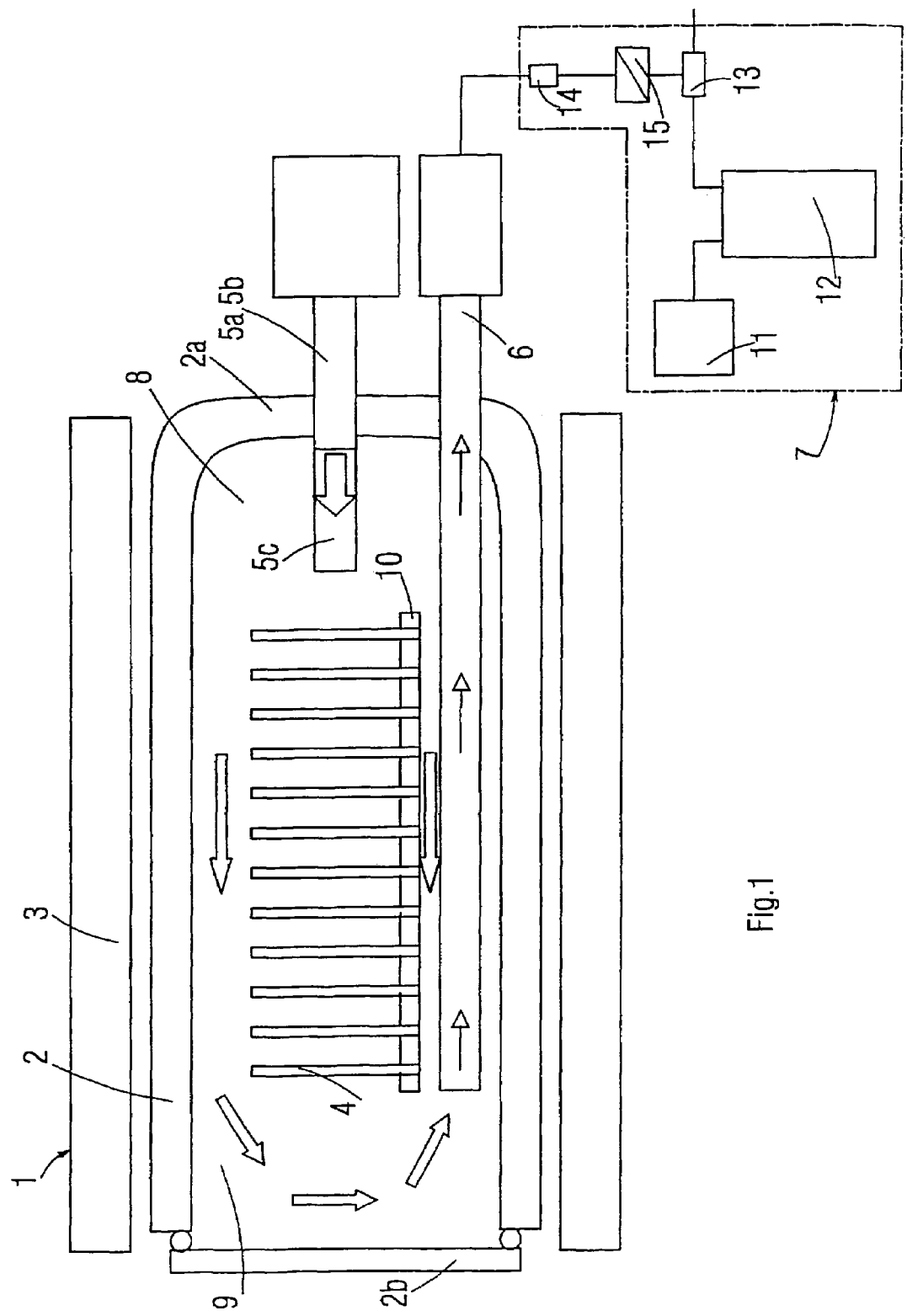

METHOD AND DEVICE FOR DOPING, DIFFUSION AND OXIDATION OF SILICON WAFERS UNDER REDUCED PRESSURE

The present invention relates to N and P type doping, diffusion and oxidation of silicon wafers in the process for production of semiconductors.

In the process for the production of integrated circuits for electronics, the techniques of fabricating semiconductors are based principally on the intrinsic modification of the atoms of the silicon material. The insertion in the silicon lattice of elements with a surplus of electrons, of the so-called N type, and a deficit of electrons, of the so-called P type, is defined by the term doping of the N type or the P type.

To render silicon semiconductive, it is necessary to add to it so-called doping elements.

The known doping elements are for example phosphorus, arsenic, antimony, boron, gallium or aluminum. In the processes most often used for doping with phosphorus or boron for example, the silicon wafers are introduced into an oven and brought to a temperature comprised generally between 800° C. and 1200° C. This temperature is necessary to permit a superficial concentration of the phosphorus or the boron on the surface of the silicon wafer.

The sources of solid, liquid or gaseous dopants are vaporized in the chamber of the oven from a carrier gas in contact with the source of dopants. The carrier gas plays the role of accelerating the doping of the dopant gas on the surface of the silicon wafer. This type of deposit takes place in the oven at atmospheric pressure. To complete the distribution between the wafers, the carrier gas must be supplied at a high gas vector flow rate, which gives rise to a large consumption of gas.

The horizontal or vertical ovens used generally have a chamber of tubular shape in which the silicon wafers are disposed on a quartz or silicon carbide support. One of the ends of the tubular chamber is provided with a door to permit the introduction of the wafers. The other end is closed by a non-removal end wall. The doping gas, the reacting gas and the vector gas are generally injected through an opening provided in the end wall of the tubular chamber.

To obtain good uniformity of treatment, it is necessary to limit the number of wafers in the oven, generally not more than 50, and to leave a relatively large space between each wafer.

The use of a vector gas also gives rise to problems of substantial condensation of acid in the oven and the environment. This acid deposition from the dopant will have repercussions on the repetitivity of the treatment of the wafer but also on the different external constituent elements of the oven, which requires frequent disassembly for cleaning of the oven and particularly of the quartz tube comprising the chamber of this latter.

On the other hand, quartz diffusers, to improve the result, are necessary, increasing the costs of use and control of the quartz portions. The returned operation after cleaning requires preliminary tests giving rise to loss of productive capacity. Other phenomena such as the lack of uniformity on the wafer and on the load and from load to load, a memory effect of doping, parasitic inclusions of dopants in the crystallographic lattice of silicon because of excess oxygen, modifications of lifetime of the minority carriers, the limitation of the diameter of the wafers, are also factors requiring a more burdensome choice of equipment.

The present invention has for its object to solve the problems mentioned above by providing a new process of doping, diffusion and oxidation.

The process according to the invention is essentially characterized in that it consists in conjointly with the introduction of the gas into the oven chamber, subjecting this latter to reduced pressure. This effect permits increasing the speed of the gas in the chamber and renders no longer necessary the use of large quantities of vector gases. Only the reactive gases are present in the silicon doping chamber.

According to another characteristic of the invention, the value of the under pressure is comprised between 100 and 800 millibars. This range of values is compatible with relatively simple means for the creation of the under pressure.

The invention also relates to a technique for injection of oxygen which permits dosing with precision the quantity of oxygen to limit the speed of cracking of the dopant, which is to say is molecular decomposition.

The invention also relates to the device permitting carrying out an operation of doping, diffusion or oxidation of the wafers. The device comprises an oven provided with a chamber hermetically closed by a door, into which chamber are introduced the wafers, said oven comprising at least one injection tube for at least one gas into the chamber to carry out one of the mentioned operations.

The device as defined is characterized essentially in that it comprises moreover at least one gas extraction tube, an aspiration means connected to the gas extraction tube, adapted to create in the chamber a constant and controlled under pressure.

Thus, the use of large quantities of vector gas of the nitrogen type is no longer necessary because of the under pressure that is created. Moreover, the peripheral condensation of acid is greatly reduced, the acid being in large part drawn into the aspiration means. The residual condensation will be itself recovered by added devices such as tiles or the like.

The present invention also has for its object a device for doping, diffusion or oxidation of silicon wafers, comprising an oven hermetically closed by a door, into which chamber are introduced said wafers, said oven comprising at least one introduction tube for at least one gas into the chamber to carry out the mentioned operations.

Figure 2:
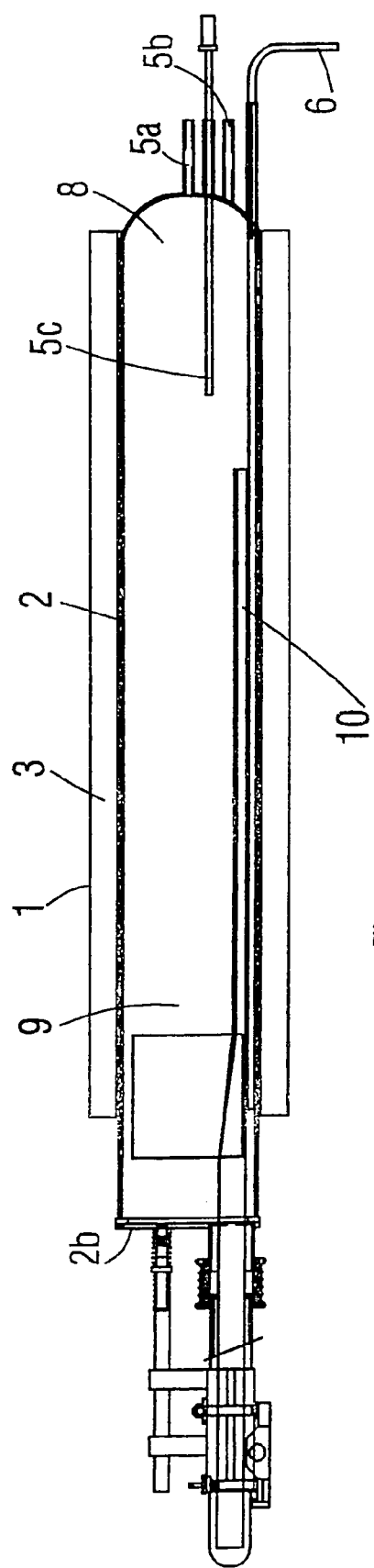

Other advantages and characteristics of the invention will become apparent from the reading of the description of a preferred embodiment, given by way of non-limiting example and illustrated by the accompanying drawings, in which:

FIG. 1 shows schematically the device for doping, diffusion or oxidation of silicon wafers according to the present invention, FIG. 2 shows in longitudinal cross-section a device for doping, diffusion or oxidation, according to the invention.

As shown, the device for doping, diffusion or oxidation of silicon wafers according to the invention comprises an oven 1 provided with a sealed chamber 2 associated with heating means 3, and into which are introduced silicon wafers that are to be subjected to the mentioned operations. The oven 1 comprises at least one introduction tube 5a, 5b, 5c, for at least one gas into the chamber 2, to achieve the mentioned operations and comprises moreover at least one gas removal tube 6, and suction means 7 connected to said gas removal tube 6, adapted to create in the chamber a constant and controlled under pressure, this suction unit being located at a distance from the oven 1 in a temperate region.

The chamber 2, for example of tubular shape, is hermetically closed by a fixed end wall 2a and by a door 2b installed at its ends, the door, in the closed position, and the end wall being perpendicular to the longitudinal axis of symmetry of the tubular chamber.

The heating means 3, constituted for example by electrical resistances, are distributed or wound about the tubular chamber and are disposed spaced from this latter or else in contact therewith.

Preferably, the tubular chamber 2 has a cross-section in the form of a circular crown. This arrangement gives the wall of the chamber good mechanical resistance to atmospheric pressure when the internal volume of the chamber is subject to under pressure.

The door 2b is secured to a mounting slidably engaged on a suitable support. The opening and closing movements of the door take place along the longitudinal axis of the tubular chamber. With the door is associated a cover extending outwardly of the chamber in which is mounted the shaft of a blade for loading wafers. This blade receives wafer supports. Preferably with this cover is associated an means for adjusting the inclination of the blade and said cover is mounted with the possibility of pivotal movement about a horizontal axis normal to the longitudinal axis of the blade. By action on the adjustment means, the blade, under vacuum, is more or less upwardly inclined, such that when the latter is loaded it can substantially come into position substantially along a horizontal plane. This adjustment can be carried out with a weight on the blade, the weight of this load corresponding to the weight of the load to be treated.

Preferably, the door 2b of the oven chamber is constituted of opaque quartz or is opacified and has a suitable sealing joint made of a material based on a fluorinated elastomer. Such a material is particularly known under the commercial name "VITON". Such a material is made by the DUPONT DE NEMOURS company.

The opaque quartz constitutes an effective barrier to infrared, burning of the sealing joint is thus avoided. So as further to reinforce the protection of the sealing joint, the terminal portion of the tubular chamber 2 (the one adapted to receive the door 2b) is made of opaque quartz. In practice, this opaque portion is assembled with the transparent door of the chamber by any means known to those skilled in the art. In the preferred embodiment, this assembly is made by welding. Again so as to reinforce the thermal protection of the joint, a thermal screen is disposed in the chamber facing the door.

The door, by its sealing joint, is applied against an annular edge of the opaque terminal portion of the tubular chamber, this annular edge being also opaque. The annular surface of this edge, facing the joint of the door, constitutes a joint plane and receives the joint under pressure. This joint is preferably mounted in an annular throat hollowed out of the door 2b. To absorb defects of parallelism between the door and the joint plane, said door is mounted floatingly on the mounting, which is to say with limited latitude of movement about two secant and orthogonal axes parallel to the plane of the joint and along an axis normal to this joint plane. Preferably, between the door and its mounting are disposed one or several resilient members and the cover comprises an axially deformable portion.

To resist heat, the walls of the oven, namely, the tubular wall of the chamber 2 and the terminal wall 2a, are constituted of quartz. The tubular chamber could be provided with an internal covering of silicon carbide of tubular shape. This covering resists radial deformation inwardly of the tubular chamber 2, particularly when this latter is subjected to high temperature.

The path of the gas in the chamber 2 of the oven 1 is established from an upstream region 8 toward a downstream region 9 located at a distance from the former, the silicon wafers 4 being disposed between these two regions along the path of the gases. These wafers 4 are disposed in the chamber 2 of the oven transversely to the direction of flow of the gases in this latter. Thus there is created a relatively great pressure drop thanks to which the gases can sweep the surfaces to be treated of the wafers.

The wafers 4 are installed on a removable support 10 introduced into the chamber 2 of the oven. This support is made of a material adapted to resist both the heat as well as the corrosive power of the gases. Thus this support could be constituted of silicon carbide or else of quartz. The support and the wafers, after positioning in the chamber, are disposed at a spacing from the end wall 2a and from the door 2b, which provide the upstream region 8, this latter being located between the end wall 2a and the position of the wafer support, and the downstream region 9 located between the door 2b and said position, the gas flow in said chamber 2 being established between one and the other zone and the region of the chamber corresponding to the position of the silicon wafer support being the hottest zone of said chamber 2.

The introduction tube or tubes 5a, 5b, 5c of the gas or gases in the chamber 2 of the oven pass through the end wall 2a of this latter or the door 2b and flow into one or the other upstream region 8 or downstream region 9 of the withdrawal tube 6, gases passing through the end wall of the oven 2a or the door 2b and flowing into the other upstream or downstream zone 8 or 9 of the chamber 2. According to the preferred embodiment, the tube or tubes 5a, 5b, 5c for introduction of gas into the chamber 2 and the withdrawal tube 6 of the gas, pass through the end wall 2a of the chamber, and the introduction tubes 5a, 5b, 5c of the gas open into the upstream region 8 of the chamber whilst the withdrawal tube 9 for the gases opens into the downstream region 9 of said chamber 2.

One of the tubes 5c for introduction of gas into the chamber 2 receives a reactive gas of the type of oxygen. Preferably, this tube 5c opens into the warmest region of this latter, nearest the position occupied by the wafer support, to avoid the anticipated cracking of the doping gas.

As mentioned above, the device according to the invention is provided with a unit 7 for sucking out gases from the chamber 2, adapted to create continuously an under pressure of constant and perfectly controlled value. This under pressure has the object of increasing the speed of the gases in the chamber and avoiding the use of vector gases.

According to the preferred embodiment, the suction means 7 comprises particularly a suction pump 11 preferably of the membrane type. This pump 11 at least for its members in contact with the gas, will be made of a material adapted to resist the corrosion of said gases. There could be used a material constituted of tetrafluoroethylene. Such a material is known under the commercial name of "TEFLON".

Again according to the preferred embodiment, the suction unit 7 comprises control and regulation members of the under pressure in the oven chamber, these control and regulation members being in communication through conduits on the one hand with the suction tube of the pump and on the other hand with the removal tube from the oven.

The control and regulation members comprise particularly a over pressure or ballast, constituted by a cylindrical chamber connected by conduits, on the one hand to the suction tubing of the pump and on the other hand to the tubing 6 for withdrawal from the oven, said overfilling capacity 12 being moreover connected to a source under pressure of over pressure gas, controlled by means of a control valve 13, directed to open and close by a circuit for measuring and controlling the dynamic under pressure in the chamber 2 of the oven 1.

This measuring and control circuit of the under pressure comprises a pressure detector 14 disposed outside the chamber, in the connection conduit extending between the over pressure capacity and the withdrawal tube of the oven or else to the over pressure capacity. This pressure detector 14 is adapted to produce a signal of an intensity proportional to the value of the under pressure, this signal being applied to the inlet of the compressor 15 which compares the value of this signal with a reference value. This comparator is connected by a power circuit to the control valve 13 for, as a function of the spacing between the value of the under pressure and the reference value, adjusting the degree of opening of the valve member of the control valve 13 and hence the flow rate of the over pressure gas or controlling the closing of this closure member of the control valve, which permits by over pressure more or less pronounced, from the pump or by the absence of over pressure, adjusting at each instance the value of the under pressure in the chamber 2 of the oven. Stated otherwise, the suction capacity of the pump being constant, the increase of flow rate of the over pressure gas is accompanied by a decrease of the flow rate of the gases extracted from the chamber of the oven, and vice versa.

The over pressure capacity 12 receives over pressure gas at ambient temperature and the hot gas is withdrawn from the oven chamber. The mixture of the gases in this over pressure capacity gives rise to condensation which is recovered by this capacity. Thus this condensation can in no way disturb the operation of the pump 11. The over pressure capacity will be removable, particularly for extracting the various condensations.

It will be seen that the degree of under pressure in the oven chamber and the control of this latter, take place outside of the oven in relatively cool and temperate regions.

The gases rejected by the pump are then neutralized with the help of any appropriate means.

The advantages of the invention are as follows:
compatibility with atmospheric technology,
uniformity of the treatment of each wafer, of each load (assembly of plates on a support), and from load to load,
repetitivity,
reproductivity after stopping,
suppression of the memory effect,
suppression of overdoses of dopants,
no limitation on the diameter of the wafers,
considerable reduction of maintenance,
reduction of costs,
peripheral cleanliness,
frequency of cleaning greatly decreased.

It follows that the teachings of the present invention are equally applicable to an oven of the horizontal type as to an oven of the vertical type. It is quite evident that the present invention can be the subject of any arrangement and modification within the field of technical equivalents, without thereby departing from the scope of the present application.

The invention claimed is:

1. A process for doping, diffusion, and oxidation of silicon wafers, said process comprising:
  placing said wafers on a removable support and introducing said support into a chamber of an oven that is hermetically sealed by a door and then heating said oven, and
  introducing gases into the chamber to accomplish the doping, diffusion, and oxidation, wherein the gases are a doping gas and a reacting gas, to the exclusion of any other gas, and said gases are introduced into the chamber under-pressure of a constant value.

2. The process of claim 1, wherein the gases flow from an upstream region located between an end wall of the oven chamber and the position of the wafer support to a downstream region located between the door and said position of the wafer support, the wafers being placed perpendicularly between said upstream and downstream region, corresponding to the hottest region in said oven chamber.

3. The process of claim 2, wherein the gases are introduced into the upstream region of the oven chamber through the end wall of the oven chamber, and the gases are extracted from the downstream region of the oven chamber through the end wall of said chamber.

4. The process of claim 3, wherein the reacting gas is introduced into the oven chamber through a tube yielding into the warmest zone of said oven chamber, nearest the position occupied by the wafer support, to avoid cracking of the doping gas.

5. The process of claim 1, wherein the value of the pressure in the oven chamber is comprised between 100 and 800 millibars.

6. The process of claim 1, wherein the gases are extracted from the oven chamber by suction with a suction pump of the membrane type.

7. The process of claim 6, wherein the pressure in the chamber is controlled and regulated by a measurement and control circuit of the under-pressure in the oven chamber by an over-pressure or ballast capacity, connected by conduits to the suction tube of the pump or to the withdrawal tube of the gases from the oven chamber, said overpressure capacity being connected to a source of pressurized gas controlled by a control valve for the opening and closing by a measurement and control circuit of the under-pressure in the oven chamber.

8. The process of claim 7, wherein the measurement and control of the pressure are effected by a pressure detector disposed outside the oven chamber, in the connection conduit extending between the oven pressure capacity and the withdrawal tube from the oven, said pressure detector being adapted to produce a signal of an intensity proportional to the value of the actual pressure, said signal being applied to the inlet of a comparator which compares the value of this signal to a reference signal, said comparator being connected by a power circuit to the control valve for, as a function of the gap between the actual pressure value and the reference value, adjusting the degree of opening of the control valve or controlling the closing of the control valve which permits by more or less pronounced feeding up of the pump or by the absence of feeding up to adjust at each instant the value of the pressure in the chamber of the oven.

9. A device for doping, diffusion, and oxidation, of silicon wafers, said device comprising:
  an oven provided with a chamber hermetically sealed by a door, said oven comprising an emplacement for introduction of a removable support on which said wafers are placed that defines an upstream region located between an end wall of said oven chamber and said wafer support, and a downstream region located between the door of the oven chamber and said wafer support,
  said end wall of the oven chamber comprising inlet tubes for introduction of a doping gas and a reacting gas into the oven chamber, in the absence of means for introduction of any other gases, and one tube for the withdrawal of the gases, connected to a suction unit, that is adapted for controlling and regulating the pressure in the oven chamber, and to create in the oven chamber a constant and controlled under-pressure, and yielding to a stable and controlled flow of the gases in said oven chamber.

10. The device of claim 9, wherein the inlet tubes for introduction of gases into the oven chamber pass through the end wall of the oven chamber and open into the upstream region and the withdrawal tube for the gases passes through the end wall of the oven chamber and opens into the downstream region of the oven chamber, so that the gases flow from the upstream region to the downstream region of the oven chamber.

11. The device of claim 9, wherein the inlet tube for introducing the gases into the oven chamber opens nearest the position occupied by the wafers, that is the warmest zone of the oven chamber.

12. The device of claim 9, wherein the suction unit comprises a pump of the membrane type.

13. The device of claim 12, wherein the pump, at least as to parts of the pump in contact with the gases, is made of a material adapted to resist corrosion by said gases.

14. The device of claim 12, wherein the suction unit comprises control and regulation members for the pressure in the oven chamber, said control and regulation members being in communication by conduits with a suction tube of the pump or the withdrawal tube of the oven chamber.

15. The device of claim 14 wherein the control and regulation members comprise an overpressure or ballast capacity, connected by conduits, to the suction tube of the pump or to the withdrawal tube for withdrawing the gases from the oven chamber, said over-pressure capacity being connected to a source of pressurized gas controlled by a control valve for the opening and closing by a measurement and control circuit of the under-pressure in the oven chamber.

16. The device of claim 15, wherein the measuring and control circuit for the under-pressure comprises a pressure detector disposed outside the oven chamber, on a connection conduit extending between the overpressure capacity and the withdrawal tube, said pressure detector being connected to a comparator, said comparator being connected by a power circuit to the control valve.

17. The device of claim 9, wherein the oven chamber has a tubular shape, with a cross-section in the shape of a circular crown.

18. The device of claim 9, wherein the walls of the oven chamber are made quartz and said oven chamber has a tubular chamber that receives an internal cladding of silicon carbide.

19. The device of claim 9, wherein the door and the end portion of the oven chamber are made of opaque quartz.

20. The device of claim 9, wherein the door is secured to a mounting engaged slidably on a support and said door is mounted floatingly on the mounting, so that said door has a limited latitude of movement about two secant and orthogonal axes parallel to a joint plane of the door with the oven chamber and along an axis normal to the joint plane.

* * * * *